United States Patent
Ito (10) Patent No.: US 8,154,941 B2
(45) Date of Patent: Apr. 10, 2012

(54) NON-VOLATILE SEMICONDUCTOR MEMORY DEVICE AND METHOD OF WRITING DATA THEREIN

(75) Inventor: Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 277 days.

(21) Appl. No.: 12/656,032

(22) Filed: Jan. 14, 2010

(65) Prior Publication Data

US 2010/0182818 A1    Jul. 22, 2010

(30) Foreign Application Priority Data

Jan. 19, 2009    (JP) ................... 2009-009120

(51) Int. Cl.
*G11C 17/18*    (2006.01)
(52) U.S. Cl. ............. 365/225.7; 365/222; 365/185.25
(58) Field of Classification Search ............. 365/225.7, 365/222, 185.25
See application file for complete search history.

(56) References Cited

U.S. PATENT DOCUMENTS

| | | | |
|---|---|---|---|
| 7,046,569 B2 | 5/2006 | Ito et al. | |
| 7,345,903 B2 | 3/2008 | Nakano et al. | |
| 7,388,770 B2 | 6/2008 | Namekawa et al. | |
| 7,613,062 B2 | 11/2009 | Nakano et al. | |
| 2008/0002504 A1* | 1/2008 | Nakano et al. ............ | 365/225.7 |

OTHER PUBLICATIONS

Matsufuji et al., "A 65nm Pure CMOS One-time Programmable Memory Using a Two-Port Antifuse Cell Implemented in a Matrix Structure," *IEEE Asian Solid-State Circuits Conference*, Nov. 12-14, 2007, Jeju, Korea, pp. 212-215. (Discussed on p. 3 of the specification).
Background Art Information Sheet provided by applicants (Sep. 10, 2009) (1 page total).

* cited by examiner

*Primary Examiner* — Jason Lappas
(74) *Attorney, Agent, or Firm* — Posz Law Group, PLC (57) ABSTRACT

A device includes a memory cell array and a control circuit, the memory cell array including word-lines, bit-lines, and memory cells arranged at the intersections of the word-lines and the bit-lines, each memory cell including an electrically programmable antifuse element. The control circuit may perform, as a first step, applying a programming voltage to one of the word-lines while applying a ground voltage to bit-lines each connected to respective selected memory cells, and as a second step, after the first step, keeping one of the one word-lines at the programming voltage while concurrently reading the electrical states of the selected memory cells, and according to the read electrical states, applying the ground voltage again to a bit-line connected to an unprogrammed selected memory cell after the first step, and applying a voltage higher than the ground voltage to a bit-line connected to a programmed selected memory cell after the first step.

20 Claims, 8 Drawing Sheets

NON-VOLATILE SEMICONDUCTOR MEMORY DEVICE AND METHOD OF WRITING DATA THEREIN

CROSS-REFERENCE TO RELATED APPLICATIONS

This application is based upon and claims the benefit of priority from the prior Japanese Patent Application No. 2009-9120, filed on Jan. 19, 2009, the entire contents of which are incorporated herein by reference.

BACKGROUND OF THE INVENTION

1. Field of the Invention

The present invention relates to electrically programmable non-volatile semiconductor memory devices and a method of writing data therein.

2. Description of the Related Art

In semiconductor integrated circuits, non-volatile one-time programmable (OTP) memories are essential elements. OTP memories do not lose stored data even when the power supply is turned off. OTP memories are widely used in a variety of applications including redundancies of large-capacity memories such as DRAM and SRAM, tuning of analog circuits, storing codes such as cipher keys, a historical record in a manufacturing process, and a chip ID for storing management information.

For the memory redundancy application, a ROM including a laser fuse that irreversibly stores information by being fused by a laser light has been used as it is a most inexpensive non-volatile memory.

The laser fuse ROM requires, however, a special fuse-blow device and a blow process using the device, thus resulting in associated high test cost. In the laser fuse, the minimum dimension depends on the wavelength of the laser light. The laser fuse thus cannot be reduced in dimension in the same way as the other circuit portions and has come to occupy a relatively larger area than the other circuit portions. The laser fuse can be programmed only in a wafer-level programming, due to the above-described programming method. It is thus hard to perform redundancy remedy in a high-speed test after packaging, a built-in self-repair by a test circuit mounted in a chip, and the like. Conventional systems that comprise the laser fuse are now required to mount electrically-programmable non-volatile memories.

Conventional systems including a plurality of chips can store various types of information in independent EEPROM chips. However, a system on chip (SoC) including a system integrated on a single chip needs to have a non-volatile memory on the same chip. Inclusion of a non-volatile memory that accumulate charges in a floating gate will increase the cost of the SoC chip due to an additional associated mask and process.

Some information such as memory redundancy information stored in the non-volatile memory does not need to be rewritten frequently. Therefore, OTP memories which can be manufactured by the current standard CMOS processes, are required in a wide variety of application.

A memory element used in OTP memories that stores information by irreversibly changing the element characteristics will be collectively referred to as a fuse element hereinbelow. Some of the fuse elements electrically and irreversibly change the element characteristics. Those fuse elements will be collectively referred to as an electrical fuse (eFuse).

One of the eFuse elements that may be manufactured in the standard CMOS processes is a gate-insulating film breakdown antifuse OTP memory. This type of memory applies a high voltage to a gate-insulating film of a MOSFET to cause a dielectric breakdown, thus forming a conductive spot that reduces the resistance of the element. A fuse element that has a high resistance when unprogrammed and has a low resistance when programmed will also be referred to as an antifuse. It is defined below that the antifuse stores data "0" when it is unprogrammed and has a high resistance, and stores data "1" when it is programmed and has a low resistance.

Conventional OTP memories using a gate-insulating film breakdown type antifuse OTP memory are described in a non-patent document 1 ("A 65 nm Pure CMOS One-time Programmable Memory Using a Two-Port Antifuse Cell Implemented in a Matrix Structure," pp. 211-215, IEEE Asian Solid-State Circuits Conference 2007). The non-patent document 1 includes a PMOSFET gate-insulating film as an antifuse and a high-voltage power-supply circuit for programming disposed outside a memory array.

Relatively-large data such as a microcomputer program is stored in a mask ROM or a flash memory in a conventional art. Programs are frequently updated during research and development, but are rarely changed during a mass production process. Frequent software update while the product in use is required only in highly advanced systems.

A mask ROMs can be manufactured at the lowest cost, but can reduce its production cost only when it is manufactured in a large-scale, because it is produced as a special part of a particular product. In addition, every change of the software requires a change in mask design in its production process. The development cost and time thus increase, which may miss the good timing to introduce the products into the market.

The flash memories need additional production processes compared to standard CMOS processes. Therefore, it requires associated cost in development of the additional processes and manufacturing cost thereof, which will result in high cost except it is used in advanced systems.

If, therefore, conventional non-volatile memories such as the mask ROM and the flash memory can be replaced by OTP memories, many products can reduce the process-development cost, the product-development cost, and the manufacturing cost.

Recent software incorporated in a chip has become complicated and reached a megabit-order data scale. The programming time of OTP memories during the manufacturing process may thus be an issue.

In conventional gate-insulating film breakdown antifuse OTP memories, the built-in charge pump generates a high voltage for programming bit by bit.

It is understood that the OTP memory program includes two stages: the first stage of the high voltage application resulting in the gate-insulating film breakdown; and the second stage of a subsequent programming current generating a joule heat effect that forms a low resistance current path.

A higher programming voltage results in faster breakdown. However, the programming voltage should not be increased inmoderately because of the limit in a boosting ability of a charge pump and the transistor breakdown voltage. Considering the programming disturb problem that unprogrammed memory cells undergoing the voltage stress may cause characteristic degradation such as increase in leak current, the appropriate time of the direct high-voltage stress is about micro-second order per one bit (one memory cell). The breakdown of the gate-insulating film depends on a probability process. For example, when a certain program voltage is applied such that half of memory cells are broken down within 1 micro-second, the other half of the memory cells may require 10 micro-seconds or 100 micro-seconds to be broken down by the program voltage. Accordingly, the program time may be set longer, taking a margin into consideration. To ensure that the data programming is completed, a verify operation and a verify circuit are required. A verify operation includes a read operation after programming, and a re-programming operation when there is an unprogrammed memory cell left.

The bit-by-bit programming time of the OTP memory may be micro-second order when the memory has a few-kilobit capacity. However, there arises a bottleneck when the memory has a megabit order capacity.

As described above, it is difficult to reduce the breakdown time per one memory cell. It is necessary to concurrently program a plurality of memory cells to reduce the total programming time (a multi-bit concurrent programming). In the multi-bit concurrent programming, a programming voltage is applied to the common terminal of the antifuse. Some of the individual terminals of the concurrently-programmed memory cells are held at a high voltage and the others are held at a low voltage depending on the programmed data ("0" or "1").

A memory cell (antifuse element) with an individual terminal held at the high voltage undergoes a lower voltage stress, thus resulting in no significant characteristic degradation in the programming time such as increase in leak current.

An antifuse element with an individual terminal held at the low voltage undergoes a higher voltage stress and breaks down, followed by a continuous current. As the multi-bit concurrent programming progresses, more antifuse elements break down causing more programming current to flow. Increase in the programming current reduces the programming voltage applied to the common terminal and increases the breakdown time of the remaining unprogrammed antifuse elements. Specifically, there is a problem that an ability of a current supply circuit for supplying the programming current limits the number of concurrently-programmable bits, thereby preventing the expected reduction of the programming time.

SUMMARY OF THE INVENTION

A non-volatile semiconductor memory device according to an aspect of the present invention includes a memory cell array and a control circuit for controlling the memory cell array, the memory cell array comprising a plurality of word-lines, a plurality of bit-lines, and a plurality of memory cells arranged at the intersections of the word-lines and the bit-lines, each memory cell comprising an electrically programmable antifuse element, the control circuit being adapted to be able to perform: as a first step, applying a programming voltage to one of the word-lines while applying a ground voltage to bit-lines each connected to respective selected memory cells to be programmed, thereby concurrently applying the programming voltage to a plurality of the selected memory cells; and as a second step after the first step, keeping one of the word-lines at the programming voltage while concurrently reading the electrical states of a plurality of the selected memory cells, and according to the electrical states of a plurality of the memory cells, applying the ground voltage again to a bit-line connected to an unprogrammed selected memory cell after the first step, and applying a voltage higher than the ground voltage to a bit-line connected to a programmed selected memory cell after the first step.

A non-volatile semiconductor memory device according to an aspect of the present invention includes a memory cell array and a control circuit for controlling the memory cell array, the memory cell array comprising a plurality of word-lines, a plurality of bit-lines, and a plurality of memory cells arranged at the intersections of the word-lines and the bit-lines, each memory cell comprising an electrically programmable antifuse element, the control circuit being adapted to be able to perform: as a first step, applying a programming voltage to one of the word-lines while applying a ground voltage to bit-lines each connected to respective selected memory cells to be programmed, thereby concurrently applying the programming voltage to a plurality of the selected memory cells; and, as a second step after the first step, keeping one of the one word-lines at the programming voltage, and leaving each selected bit-line floating and sensing the resulting voltage of each selected bit-line to determine which of the selected memory cells is unprogrammed after the first step.

A method of writing data in a non-volatile semiconductor memory device according to an aspect of the present invention includes a memory cell array, the memory cell array comprising a plurality of word-lines, a plurality of bit-lines, and a plurality of memory cells arranged at the intersections of the word-lines and the bit-lines, each memory cell comprising an electrically programmable antifuse element, the method comprising: as a first step, applying a programming voltage to one of the word-lines while applying a ground voltage to bit-lines each connected to respective selected memory cells to be programmed, thereby concurrently applying the programming voltage to a plurality of the selected memory cells; and as a second step after the first step, keeping one of the word-lines at the programming voltage while concurrently reading the electrical states of a plurality of the selected memory cells, and according to the electrical states of a plurality of the memory cells, applying the ground voltage again to a bit-line connected to an unprogrammed selected memory cell after the first step, and applying a voltage higher than the ground voltage to a bit-line connected to a programmed selected memory cell after the first step.

DETAILED DESCRIPTION OF THE EMBODIMENTS

Figure 1:
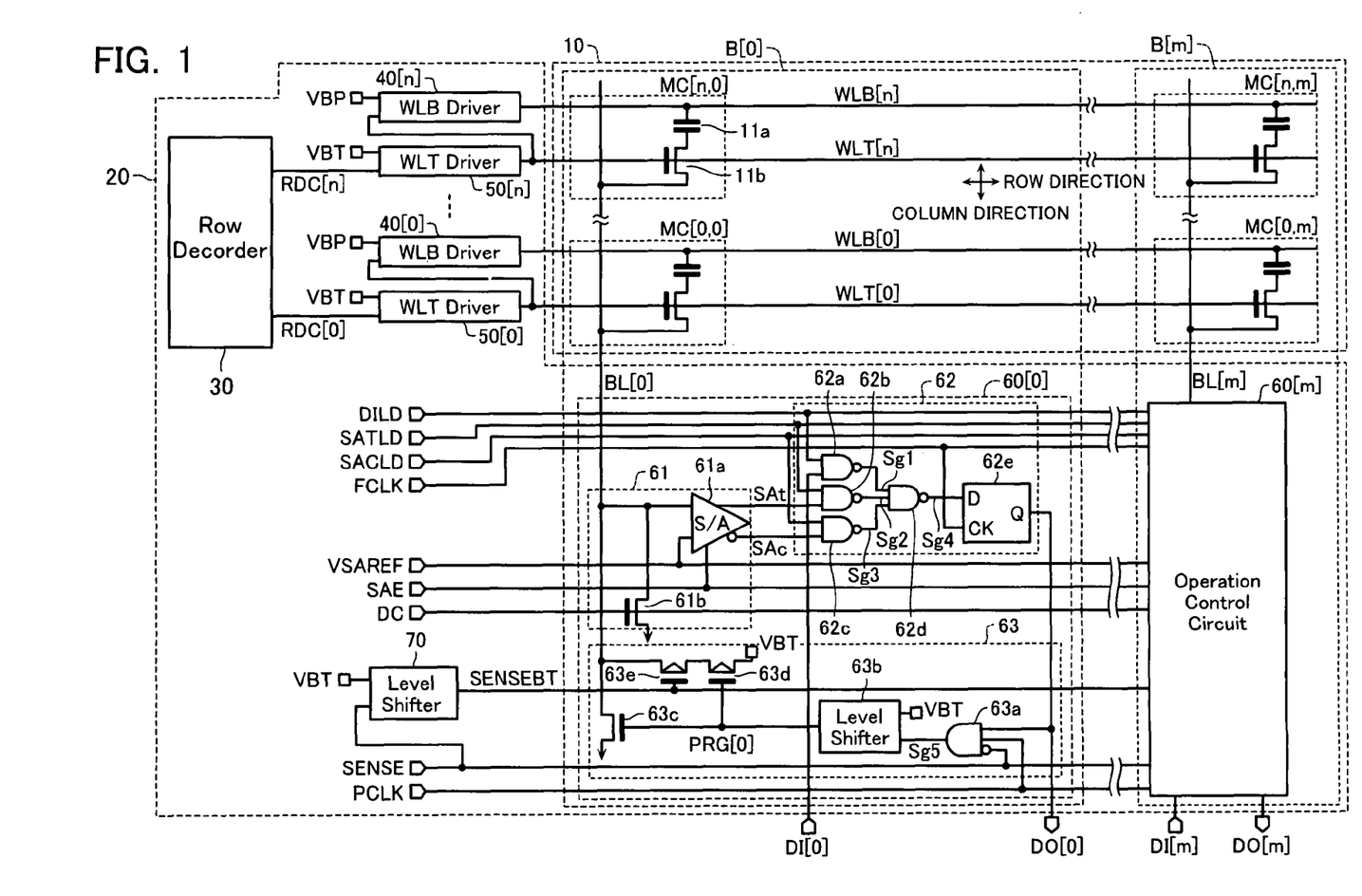
FIG. 1 is a schematic diagram of a non-volatile semiconductor memory device according to an embodiment of the present invention.

With reference the accompanying drawings, non-volatile semiconductor memory devices according to embodiments of the present invention will be described below.
(Schematic Configuration of Non-Volatile Semiconductor Memory Device According to an Embodiment)
Referring to FIG. 1, a schematic configuration of a non-volatile semiconductor memory device according to an embodiment will be described. FIG. 1 is a schematic diagram of the non-volatile semiconductor memory device according to the embodiment. It is assumed that the following circuits operate on the common power supply voltage VDD. Digital values are used to show a signal of the power supply voltage VDD as "H" and a signal of the ground voltage (VSS (0V)) as "L."

Referring to FIG. 1, the non-volatile semiconductor memory device according to the embodiment includes a memory cell array 10 and a control circuit 20. The memory cell array 10 includes a plurality of memory cells MC arranged in a matrix. Each memory cell MC stores one-bit information by whether a gate-insulating film is broken down or not, as will be described below. The control circuit 20 writes and reads information to and from the memory cell array 10.

The memory cell array 10 includes a first word-line WLB [j] (j=0 to n), a second word-line WLT [j] (j=0 to n), and a bit-line BL [k] (k=0 to m), which are interconnected in the memory cell array 10. The memory cell array 10 also includes a memory cell MC [j, k] (j=0 to n, k=0 to m) at the intersections of the word-lines and the bit-lines. Note that in the following description, the first word-line WLB [j] is sometimes collectively referred to as, for example, the first word-line WLB, without distinguishing 1-n individually. The same holds true for the second word-line WLT [j], the bit-line BL [k], and the memory cell MC [j, k], and they may instead be collectively referred to as, for example, the second word-line WLT, the bit-line BL, and the memory cell MC, respectively.

One first word-line WLB and one second word-line WLT are provided as a pair for one memory cell MC. Each of the first word-line WLB and the second word-line WLT is arranged at a predetermined pitch in the column direction and extends in the row direction. The bit-line BL is arranged at a predetermined pitch in the row direction and extends in the column direction (that is perpendicular to the row direction).

The first word-line WLB and the second word-line WLT extend in the row direction in parallel to each other. Each memory cell MC resides at the intersection of the bit-line BL and the first and second word-lines WLB and WLT. Thus, the memory cells MC are arranged in a matrix in the memory cell array 10. The memory cell MC includes an anti fuse element 11a and an N-MOS transistor 11b. The drain of the N-MOS transistor 11b connects to the first end of the antifuse element 11a. The second end of the antifuse element 11a connects to the first word-line WLB. The source of the N-MOS transistor 11b connects to the bit-line BL. The control gate of the N-MOS transistor 11b connects to the second word-line WLT. By rendering the N-MOS transistor 11b conductive, the memory cell MC is selected and a voltage for data read or write is applied across the ends of the memory cell MC.

The antifuse element 11a includes, for example, an MOS transistor whose drain, source, and substrate terminal are short-circuited. The antifuse element 11a has a high resistance (for example, a few G Ω) before the gate-insulating film of the MOS transistor is broken down.

The gate-insulating film of the antifuse element 11a is broken down when a predetermined programming voltage is applied across the ends of the film. The antifuse element 11a thus changes its electrical state. Specifically, the gate-insulating film breakdown decreases the resistance of the antifuse element 11a (to, for example, a few MΩ). The non-volatile semiconductor memory device according to this embodiment stores one-bit information in one memory cell MC due to the irreversible resistance change of the antifuse element 11a. The mechanism may be described as follows in more detail. A programming voltage VBP is applied to the first word-line WLB and the ground voltage VSS is applied to the bit-line BL. An on-voltage VBT is applied to the second word-line WLT to render the N-MOS transistor 11b conductive. The programming voltage VBP is then applied across the ends of the antifuse element 11a. The antifuse element 11a continues to be applied with the voltage VBP for a predetermined period, resulting in the breakdown of the gate-insulating film. The memory cell MC may thus be programmed with "1" data (written with information). The amount of time before the breakdown largely varies among the memory cells MC.

The control circuit 20 is adapted to be able to perform a concurrent programming mode. The mode concurrently programs selected memory cells sMC formed along one word-line WLB. The selected memory cell sMC means a memory cell MC that is selected to be written (programmed) with "1" data (i.e., a memory cell MC whose gate-insulating film is to be broken down) among the memory cells MC.

The operations of the concurrent programming mode may include a first write operation and a subsequent second write operation, as described below.

In the first write operation, the programming voltage VBP is concurrently applied across the terminals of each of the selected memory cells sMC formed along one word-line WLB.

In the subsequent second write operation, the control circuit 20 concurrently reads the electrical states of the selected memory cells sMC which have undergone the first write operation (i.e., the memory cells MC to be written with "1" data, which are formed along one word-line WLB). According to the electrical states, the control circuit 20 then concurrently apply the programming voltage VBP only to the selected memory cells sMC that are unprogrammed after the first write operation. In other words, in the second write operation, no programming voltage VBP is applied across the terminals of each antifuse element 11a of the selected memory cells sMC that are programmed during the first write operation.

The first write operation will now be generally described. In the first write operation, the control circuit 20 increases the voltages of all bit-lines BL to the on-voltage VBT while setting all of the word lines WLB and WLT in an unselected state (a first process).

After the first process, the control circuit 20 applies the programming voltage VBP to the selected first word-lines WLB ("selected first word-lines sWLB")(a second process).

After the second process, the control circuit 20 decreases the voltages of the bit-lines BL connected to the selected memory cells sMC ("selected bit-lines sBL") to the ground voltage Vss. The control circuit 20 may thus concurrently apply the programming voltage VBP to the selected memory cells sMC arranged along the selected first word-line WLB, thereby performing the concurrent program. The first write operation will be described later in more detail.

The second write operation will now be generally described. In the second write operation, in order to determine the unprogrammed memory cell sMC after the first write operation, the control circuit 20 first leaves the selected bit-lines sBL floating (a third process). The control circuit 20 then senses the voltage of each selected bit-line sBL, and grounds only the selected bit-line sBL whose voltage is lower than the reference voltage, and applies the on-voltage VBT to the selected bit-line sBL whose voltage is higher than the reference voltage (a fourth process). The control circuit 20 may thus concurrently apply the programming voltage VBP only to the unprogrammed selected memory cells sMC after the first write operation. The circuit 20 may thus control the voltage reduction of the first word-line WLB and reduce the programming time.

The control circuit 20 repeatedly performs the second write operation at a predetermined cycle until the writing to all selected memory cells sMC is completed. The control circuit 20 may concurrently read information from the selected memory cells sMC.

Referring to FIG. 1, the control circuit 20 includes a row decoder circuit 30, a plurality of first word-line driver circuits 40 [j] (j=0 to n), a plurality of second word-line driver circuits 50 [j] (j=0 to n), a plurality of operation control circuits 60 [k] (k=0 to m), and a first level shifter 70. Note that in the following description, if the first word-line driver circuits 40 [j] need not be individually distinguished, they may be collectively represented as, for example, a first word-line driver circuit 40. The same holds true for the second word-line driver circuits 50 [j] and the operation control circuits 60 [k], and they may be collectively represented as, for example, a second word-line driver circuit 50 and an operation control circuit 60, respectively.

Referring to FIG. 1, the row decoder circuit 30 applies a signal RDC [j] (j=0 to n) to each second word-line driver circuit 50. The signal RDC [j] is a signal to activate the second word-line driver circuit 50. The signal RDC [j] becomes "H" to perform the write operation (the first write operation and the second write operation) and the read operation to the memory cells MC [j, k] arranged in the row direction. Note that in the following description, if the signal RDC [j] (j=1 to n) needs not be individually distinguished, they may be collectively represented as a "signal RDC."

Referring to FIG. 1, in the programming operation, the first word-line driver circuit 40 generates the programming voltage VBP in response to the output signal from the second word-line driver circuit 50. The first word-line driver circuit 40 also applies the power supply voltage VDD to the first word-line WLB during the read operation. During the programming operation, the programming voltage VBP applied to the first word-line WLB is used to break down the gate-insulating film of the antifuse element 11a of the memory cell MC (for the write operation).

Referring to FIG. 1, in response to the signal RDC, the second word-line driver circuit 50 generates the on-voltage VBT and applies it to the second word-line WLT. The on-voltage VBT applied to the second word-line WLT is used to render the N-MOS transistor 11b conductive.

The operation control circuit 60 [k] (k=1 to m) controls the writing and reading information to and from the memory cell array 10. Referring to FIG. 1, one operation control circuit 60 [k] is provided to memory cells MC [0, k] to MC [n, k] arranged in one line in the column direction.

Referring to FIG. 1, the operation control circuit 60 includes a first to a third control portion 61 to 63. The first control portion 61 determines the electrical state of the memory cell MC. The portion 61 outputs the determination results to the second control portion 62. The second control portion 62 stores the electrical state of the memory cell MC during each operation. The portion 62 outputs the stored state to the third control portion 63 and an external device. The third control portion 63 controls the potential of the bit-line BL in response to the output from the second control portion 62 or the like.

Referring to FIG. 1, the first control portion 61 includes a sense amplifier 61a and an n-MOS transistor 61b.

The sense amplifier 61a starts an operation upon the input of the signal SAE. The sense amplifier 61a compares the voltage of the bit-line BL and the reference voltage VSAREF to output a signal SAt [k] (k=0 to m) and a signal SAc [k] (k=0 to m). If the voltage of the bit-line BL is higher than the reference voltage VSAREF, the signal SAt [k]=1 and the signal SAc [k]=0. If the voltage of the bit-line BL is lower than the reference voltage VSAREF, the signal SAt [k]=0 and the signal SAc [k]=1. The signal SAE and the signal VSAREF are common signals for all operation control circuits 60 [0] to 60 [m]. Note that in the following description, the signal SAt [k] and the SAc [k] may not be individually distinguished, and may instead be collectively represented as the signal SAt and the signal SAc.

The drain of the n-MOS transistor 61b connects to the bit-line BL. The source of the n-MOS transistor 61b is grounded. The control gate of the n-MOS transistor 61b receives the input of the signal DC. The signal DC is a common signal for all operation control circuits 60 [0] to 60 [m]. The signal DC becomes "H" for a predetermined period to discharge the bit-line BL during the data read.

Referring to FIG. 1, the second control portion 62 includes NAND circuits 62a to 62d and a flip-frop circuit 62e.

The NAND circuit 62a to 62d together function as a selector circuit that selectively enters a signal DI [k] and the signals SAt and SAc to the flip-frop circuit 62e in response to signals DILD, SATLD, SACLD, and FCLK. The NAND circuit 62a receives the signal DI [k] (k=0 to m) and the signal DILD and outputs the resulting signal Sg1 to the NAND circuit 62d. The signal DILD is a common signal for all operation control circuits 60 [0] to 60 [m]. The signal DILD becomes "H" to enter the signal DI [k] to the flip-frop circuit 62e.

The NAND circuit 62b receives the signal SATLD and the signal SAt and outputs the resulting signal Sg2 to the NAND circuit 62d. The signal SATLD is a common signal for all operation control circuits 60 [0] to 60 [m]. The signal SATLD becomes "H" to enter the signal SAt to the flip-frop circuit 62e.

The NAND circuit 62c receives the signal SACLD and the signal SAc and outputs the resulting signal Sg3 to the NAND circuit 62d. The signal SACLD is a common signal for all operation control circuits 60 [0] to 60 [m]. The signal SACLD becomes "H" to enter the signal SAc to the flip-frop circuit 62e.

The NAND circuit 62d receives the signal Sg1, the signal Sg2, and the signal Sg3 and outputs the resulting signal Sg4 to the input terminal D of the flip-frop circuit 62e.

The flip-frop circuit 62e latches the signal inputted to the input terminal D in response to the rising edge of the synchronization clock signal FCLK inputted to the clock input terminal CK. The circuit 62e then outputs the latched signal from the output terminal Q as a signal DO [k] (k=0 to m).

Referring to FIG. 1, the third control portion 63 includes an AND circuit 63a, a second level shifter 63b, an N-MOS transistor 63c, and P-MOS transistors 63d and 63e.

The AND circuit 63a receives the inversion signal of a signal SENSE, a signal PCLK, and the signal DO [k] and outputs the resulting signal Sg5 to the second level shifter 63b. The signal SENSE is a common signal for all operation control circuits 60 [0] to 60 [m]. The signal SENSE of "L" enables programming depending on the output signal from the flip-frop circuit 62e. In the data write operation, the signal PCLK becomes "H" for a predetermined period to reduce the bit-line BL to the ground voltage.

In response to the signal Sg5, the second level shifter 63b converts the signal Sg5 to a signal PRG [k] (k=0 to m) and outputs it. The signal Sg5 has the power supply voltage VDD, and the signal PRG [k] has the on-voltage VBT. The signal PRG [k] is inputted to the control gate of the N-MOS transistor 63c and the control gate of the P-MOS transistor 63d. The source of the N-MOS transistor 63*c* is grounded. The drain connects to an end of the bit-line BL. The control gate of the N-MOS transistor 63*c* receives the input of the signal PRG [k].

The source of the P-MOS transistor 63*d* is applied with the on-voltage VBT. The drain connects to the source of the P-MOS transistor 63*e*. The drain of the P-MOS transistor 63*e* connects to an end of the bit-line BL. The control gate receives a signal SENSEBT. The signal SENSEBT is a common signal for all operation control circuits 60 [0] to 60 [m]. In the reading operation, the signal SENSEBT reaches the level of the on-voltage VBT to release the precharge of the bit-line BL.

(Write Operation of Non-Volatile Semiconductor Memory Device According to an Embodiment).

Figure 2:
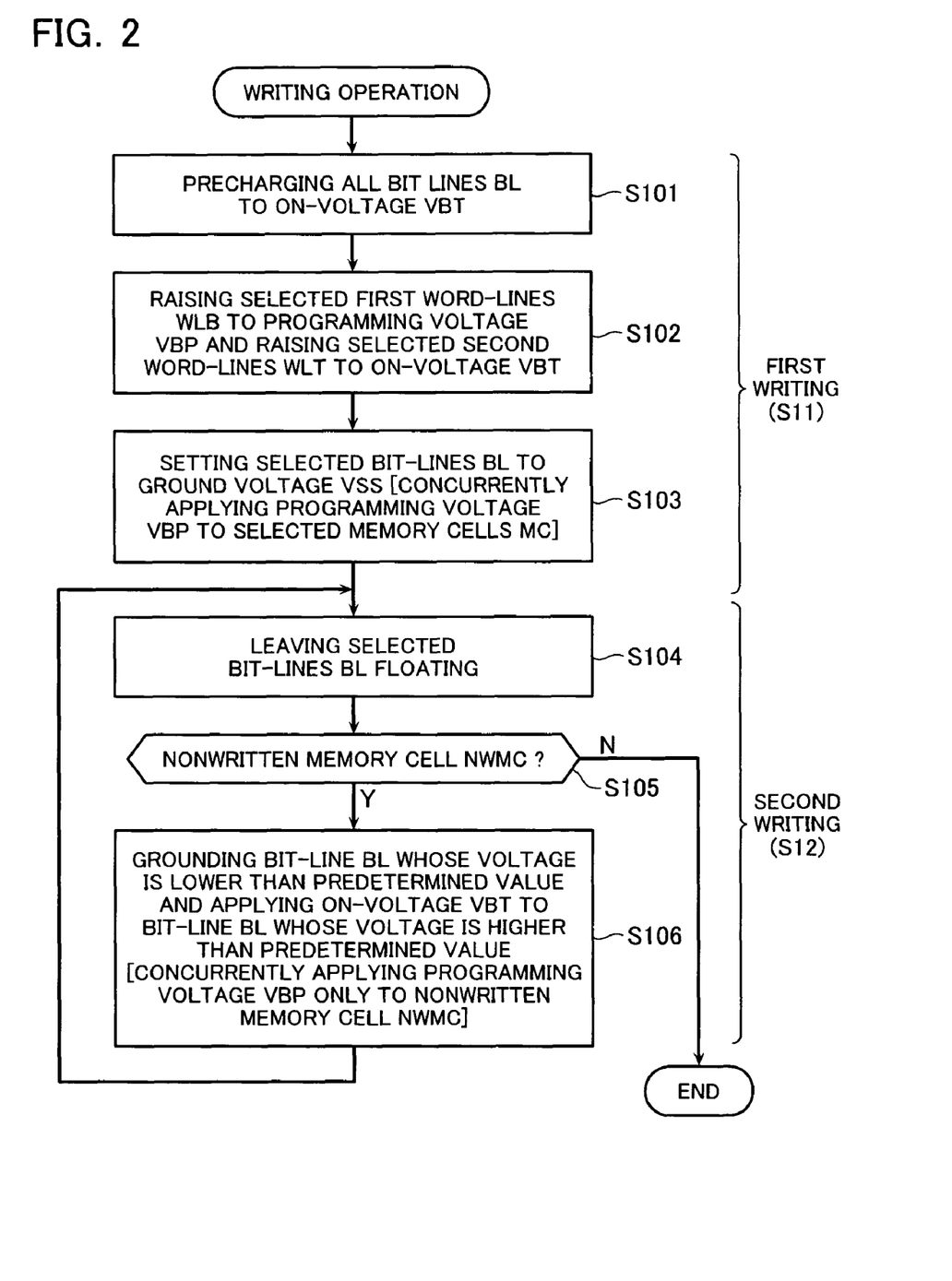
FIG. 2 is a flowchart of a write operation according to an embodiment.
Figure 3A:
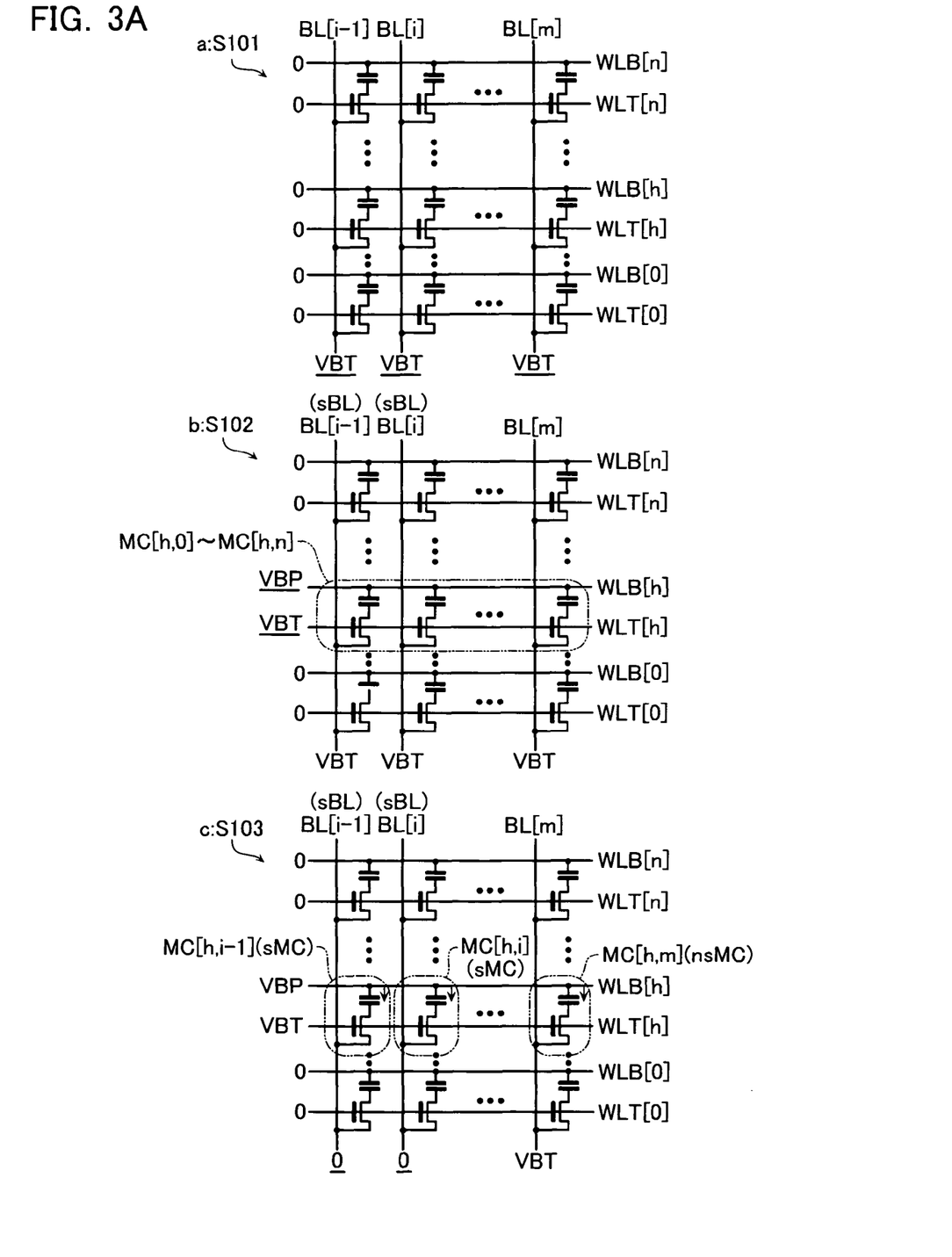
FIG. 3A is a circuit diagram illustrating a write operation according to an embodiment.
Figure 3B:
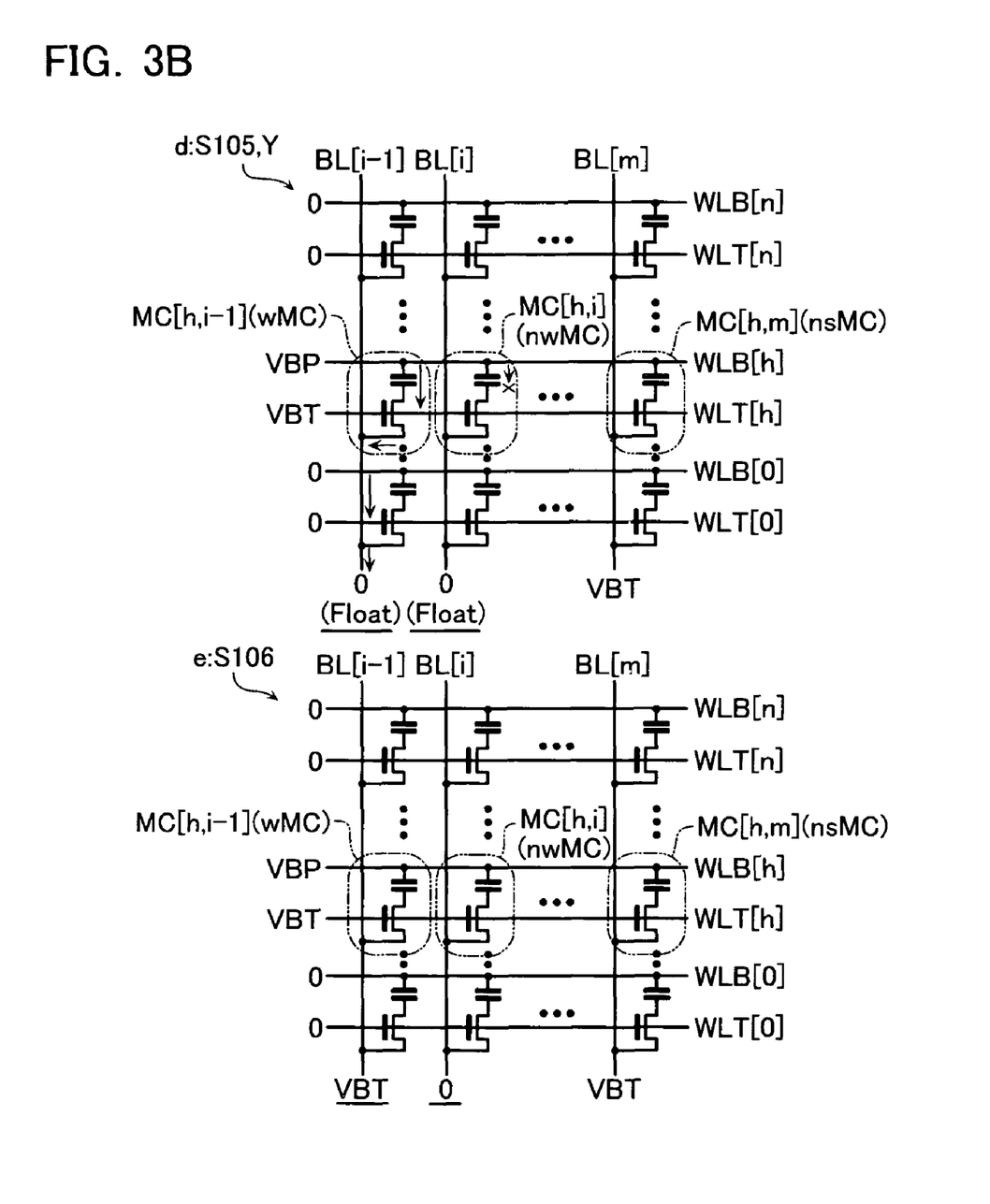
FIG. 3B is a circuit diagram illustrating a write operation according to an embodiment.

Referring to FIG. 2, FIG. 3A, and FIG. 3B, a description is given of a write operation (a first write operation and a second write operation) of a non-volatile semiconductor memory device according to an embodiment. FIG. 2 is a flowchart of the write operation of the control circuit 20. Referring to FIG. 2, step S11 (step S101 to step S103) represents the first write operation and step S12 (step S104 to the S106) represents the second write operation. FIG. 3A and FIG. 3B are circuit diagrams for illustrating the operation. Note that for ease of discussion, two memory cells MC [h, i−1] and MC [h, i] of the memory cells MC [h, k] along one first word-line WLB [h] are concurrently programmed by way of example, but three or more memory cells may be concurrently programmed and those skilled in the art will easily appreciate the associated operation from the following two examples.

Step S11 and step S12 will be described in more detail below. First, the control circuit 20 precharges all bit-lines BL to the on-voltage VBT (step S101). For example, as shown by the symbol "a" in FIG. 3A, the bit-lines BL [0] . . . , BL [i−1], BL [i] . . . , BL [m] are precharged to the on-voltage VBT.

Then, the control circuit 20 applies the on-voltage VBT to the selected second word-line WLT ("selected second word-line sWLT") and applies the programming voltage VBP to the selected first word-line WLB ("selected first word-line sWLB") (step S102). For example, as shown by the symbol "b" in FIG. 3A, only the first word-line WLB [h] (the selected first word-line sWLB) is applied with the programming voltage VBP and only the second word-line WLT [h] (the selected second word-line sWLT) is applied with the on-voltage VBT.

Then, the control circuit 20 sets the selected bit-line sBL to the ground voltage Vss (step S103). In other words, the control circuit 20 concurrently applies the programming voltage VBP to the selected memory cells sMC. For example, as shown by the symbol "c" in FIG. 3A, the bit-lines BL [i−1] and BL [i] (the selected bit-line sBL) connected to the selected memory cells MC [h, i−1] and MC [h, i] that are to be written with "1" data are grounded, while the voltage of the bit-line BL [m] connected to the nonselected memory cell nsMC (for example, MC [h, m]) is kept at the voltage VBT.

Then, the control circuit 20 leaves the selected bit-line sBL floating (step S104). Specifically, the transistor 63*c* shown in FIG. 1 is rendered non-conductive.

Then, the control circuit 20 determines if there is a selected memory cell sMC not programmed with "1" data in the first write operation ("nonwritten memory cell nwMC")(step S105). Specifically, step S105 determines by sensing the voltage of the selected bit-line sBL connected to the selected memory cell sMC. If the sensed voltage of the selected bit-line sBL is lower than the reference voltage, the selected memory cell sMC connected to the selected bit-line sBL is determined to be a nonwritten memory cell nwMC (step S105, Y). If the sensed voltage of the selected bit-line sBL is higher than the reference voltage, the selected memory cell sMC connected to the selected bit-line sBL is determined to be a written memory cell wMC rather than a nonwritten memory cell nwMC (step S105, N).

It is assumed here that as shown by the symbol "d" in FIG. 3B, after one cycle of the first write operation, the antifuse element 11*a* of the memory cell MC [h, i−1] is broken down, while the antifuse element 11*a* of the memory cell MC [h, i] is not broken down. Specifically, it is assumed that at the symbol "d" in FIG. 3B, the memory cell MC [h, i−1] is the written memory cell wMC (the programmed selected memory cell sMC after the first write operation) and the memory cell MC [h, i] is the nonwritten memory cell nwMC.

The breakdown of the antifuse element 11*a* allows current to flow through the memory cell MC [h, i−1] from the first word-line WLB [h] to the bit-line BL [i−1]. This may increase (charge) the voltage of the floating selected bit-line BL [i−1] at a floating state. The memory cell MC [h, i] whose antifuse element 11*a* is not broken down does not allow current to flow from the first word-line WLB [h] to the bit-line BL [i]. The voltage of the selected bit-line BL [i] thus remains unchanged from the ground potential.

Thus, step S105 determines if the programming is incomplete after the first write operation (i.e., there is a nonwritten memory cell nwMC) by sensing the voltage of the floating selected bit-line sBL.

If step S105 determines that a nonwritten memory cell nwMC exists (step S105, Y), the control circuit 20 sets again the voltage of the selected bit-line sBL connected to the nonwritten memory cell nwMC to the ground voltage, while the circuit 20 sets the voltage of the selected bit-line sBL connected to the written memory cell wMC to the on-voltage VBT (step S106). In other words, during the second write operation, the control circuit 20 holds the selected first word-line sWLB at the programming voltage VBP and concurrently applies the programming voltage VBP only to the nonwritten memory cells nwMC, while the circuit 20 applies no programming voltage VBP to the written memory cell wMC. For example, as shown by the symbol "e" in FIG. 3B, if the gate-insulating film of the antifuse element 11*a* of the memory cell MC [h, i−1] is broken down and it is determined that "1" data is written to the memory cell MC [h, i−1], the voltage of the selected bit-line BL [i−1] is set to the on-voltage VBT. No current thus flows through the memory cell MC [h, i−1], thereby controlling the voltage reduction of the selected first word-line WLB [h]. The bit-line sBL [i] connected to the memory cell MC [h, i] that is not written with data continues to be applied with the ground voltage.

After step S106, the control circuit 20 performs step S104 again. Thus, the control circuit 20 repeats steps S104 to S106, and stops the write operation if it is determined at step S105 that there is no nonwritten memory cell nwMC (step S105, N).

Figure 4:
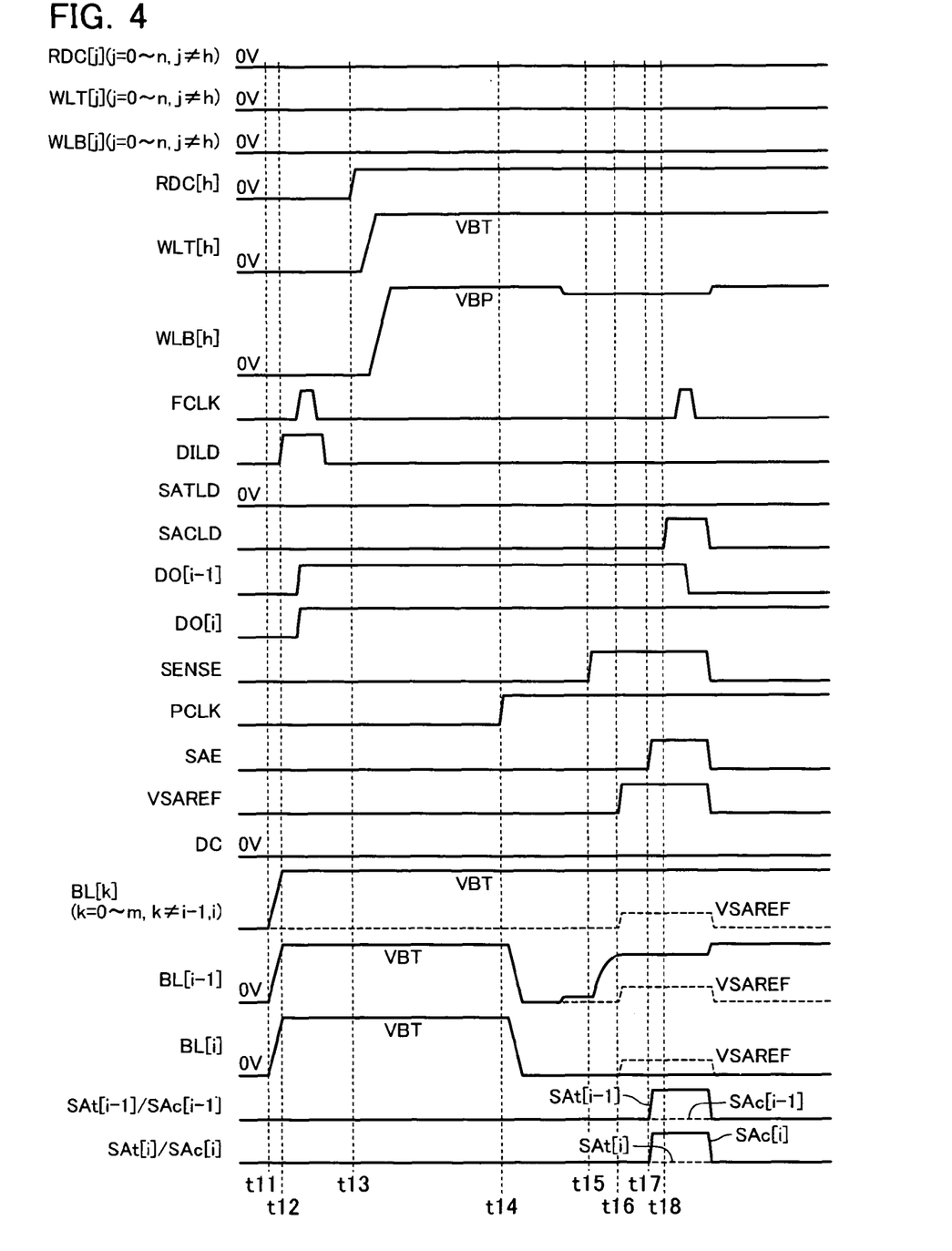
FIG. 4 is a timing diagram of a write operation according to an embodiment.

Referring now to FIG. 4, a more detailed description is given of the write operation (the first write operation and the second write operation) of the non-volatile semiconductor memory device acceding to this embodiment in connection with the timings of the rising edges and the falling edges of the various types of signals. FIG. 4 is a timing diagram of the write operation. FIG. 4 shows an example where the memory cells MC [h, i−1], MC [h, i] at the intersections of the bit-line BL [i−1], the bit-line BL [i], and the first word-line WLB [h] are written with "1" data, while the other memory cells MC [h, k] (k=0 to m, k≠i−1, i) are not written with data, but are kept at "0."

At start of the write operation, therefore, the signal DI [i−1]=the signal DI [i]=1, the signal DI [k] (k=0 to m, k≠i−1, i)=0. It is assumed here that the memory cell MC [h, i−1] is easily written, while the memory cell MC [h, i] is hard to be written (has a long time to be programmed), and as a result, becomes the nonwritten memory cell nwMC.

First, at time t11, the signal PRG [k] is set to "L" and the signal SENSEBT is set to "L," thereby allowing all bit-lines BL to be precharged to the on-voltage VBT via the P-MOS transistors 63d and 63e.

Then, at time t12, the signal DILD becomes "H," then the signal FCLK rises to "H." The flip-frop circuit 62e sets the signals DI [i−1] and DI [i] to "H" and holds them.

Then, at time t13, the signal RDC [h] becomes "H" (RDC [j] (j=0 to n, j≠h)=0). This activates the first word-line driver circuit 40 [h] and the second word-line driver circuit 50 [h]. The voltages of the second word-line WLT [h] and the first word-line WLB [h] are then raised to the on-voltage VBT and the programming voltage VBP, respectively.

Then, at time t14, the signal PCLK becomes "H." The output signal Sg5 of the AND circuit 63a thus becomes "H." The output signals PRG [i−1] and PRG [i] of the level shifter 63b then become "H." The transistor 63c is thus rendered conductive, thereby making the bit-lines BL [h, i−1] and BL [h, i] grounded. The memory cells MC [h, i−1] and [h, i] are thus applied with the voltage VBP, thereby starting the write operation. The memory cells MC vary in the ease of writing (the ease of the gate-insulating film breakdown). It is assumed in this description that the writing is complete in the memory cell MC [h, i−1] by having the gate-insulating film of the antifuse element 11a broken down, but the writing is incomplete in the memory cell MC [h, i].

Then, at time t15, the signal SENSE becomes "H." The signal Sg5 thus becomes "L." The N-MOS transistor 63c is thus rendered non-conductive, thereby leaving the bit-lines BL [i−1] and BL [i] floating. If then the first word-line WLB [h] continues to be applied with the voltage VBP, the bit-line BL [i−1] connected to the written memory cell MC [h, i−1] (the written memory cell wMC) gradually increases in voltage. The bit-line BL [i] connected to the nonwritten memory cell MC [h, i] (the nonwritten memory cell nwMC) varies little in voltage.

Then, the change in the voltage of the bit-line BL is sensed to determine whether the selected memory cells sMC such as the memory cell MC [h, i−1] and the memory cell MC [h, i] are written or not. Specifically, at time t16, the signal VSAREF as the reference voltage is set to "H," and at time t17, the signal SAE is set to "H." This activates the sense amplifier 61a, allowing the signal SAt and the signal SAc to change depending on the voltage of the bit-line BL. If the voltage of the bit-line BL is higher than the signal VSAREF, SAt=1 and the signal SAc=0. If the voltage of the bit-line BL is lower than the signal VSAREF, SAt=0 and SAc=1. Therefore, in this example, the signal SAt [i−1]=1, the signal SAc [i−1]=0, the signal SAt [i]=0, and the signal SAc [i]=1.

Then, at time t18, the signal SACLD becomes "H." Then the signal FCLK rises to "H." The signal SAc is thus incorporated by the flip-frop circuit 62e. For the example in FIG. 4, the signal DO [i−1] is held at "L." The signal DO [i] continues to be held at "H". It is thus determined that the memory cell MC [h, i] is not written with data. The bit-line BL [i] is then set again to the ground voltage. Specifically, the second write operation is performed. The operations from time t14 to t18 in FIG. 4 are repeated until all selected memory cells sMC are written with data.

(Read Operation of Non-Volatile Semiconductor Memory Device According to an Embodiment)

Figure 5:
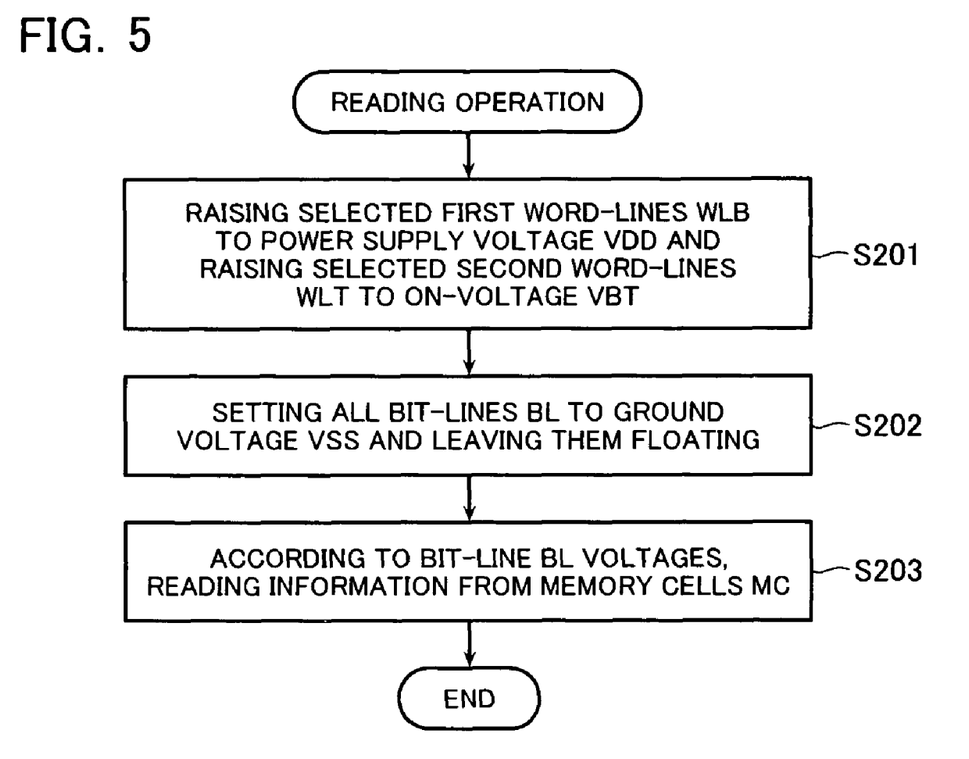
FIG. 5 is a flowchart of a read operation according to an embodiment.
Figure 6:
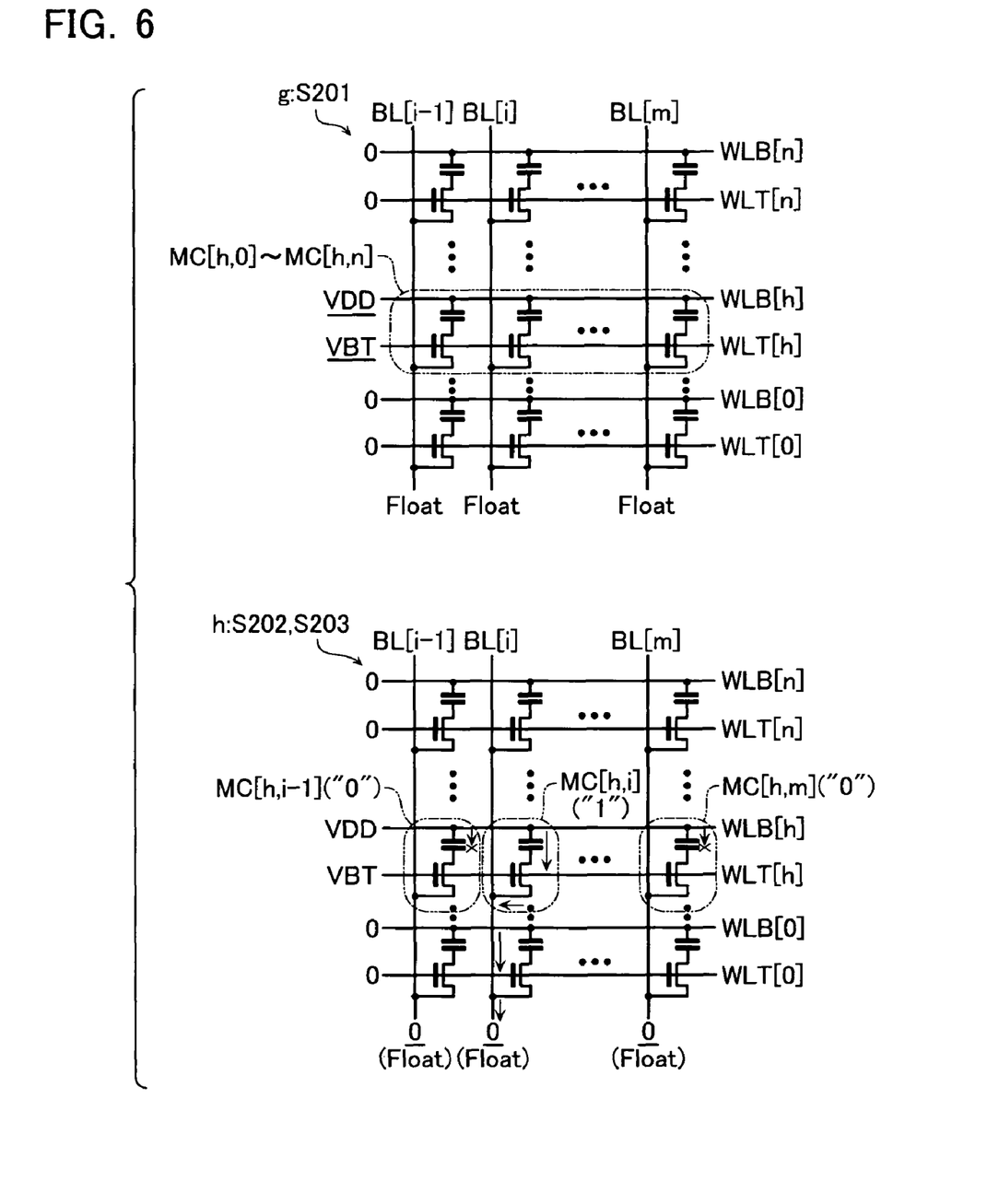
FIG. 6 is a circuit diagram illustrating a read operation according to an embodiment.

Referring to FIG. 5 and FIG. 6, a general description is given of a read operation of a non-volatile semiconductor memory device according to an embodiment. FIG. 5 is a flowchart of a read operation of the control circuit 20. FIG. 6 is a circuit diagram illustrating the read operation.

In FIG. 6, it is assumed that the memory cells MC [h, k] (k=1 to m) along the first word-line WLB [h] are to be concurrently read, and the memory cell MC [h, i−1] and the memory cell [h, i] are written with "1" data and the others with "0."

First, the control circuit 20 raises the voltage of the selected first word-line sWLB to the power supply voltage VDD and raises the selected second word-line sWLT to the on-voltage VBT (step S201). For example, as shown by the symbol "g" in FIG. 6, the first word-line WLB [h] is raised to the power supply voltage VDD and the second word-line WLT [h] is raised to the on-voltage VBT.

Then, the control circuit 20 precharges all bit-lines BL to the ground voltage Vss, and then leaves them floating (step S202).

Then, the control circuit 20 senses the voltage of the bit-line BL, and reads the held data of the memory cell MC according to the sensed voltage (step S203). For example, as shown by the symbol "h" in FIG. 6, the bit-lines BL [0], . . . , BL [i−1], BL [i], . . . , BL [m] are floating, and thus a current flows from the first word-line WLB [h] to the bit-line BL [i−1] and the bit-line BL [i] via the memory cells MC [h, i−1] and MC [h, i] written with "1" data, thereby charging the bit-lines BL [i−1] and the BL [i]. No current flows to the bit-line BL [k] connected to the nonwritten memory cells MC [h, k] (k≠i−1, i), thus not charging the bit-line BL [k]. The control circuit 20 senses the potential charged to the bit-line BL to read information.

Figure 7:
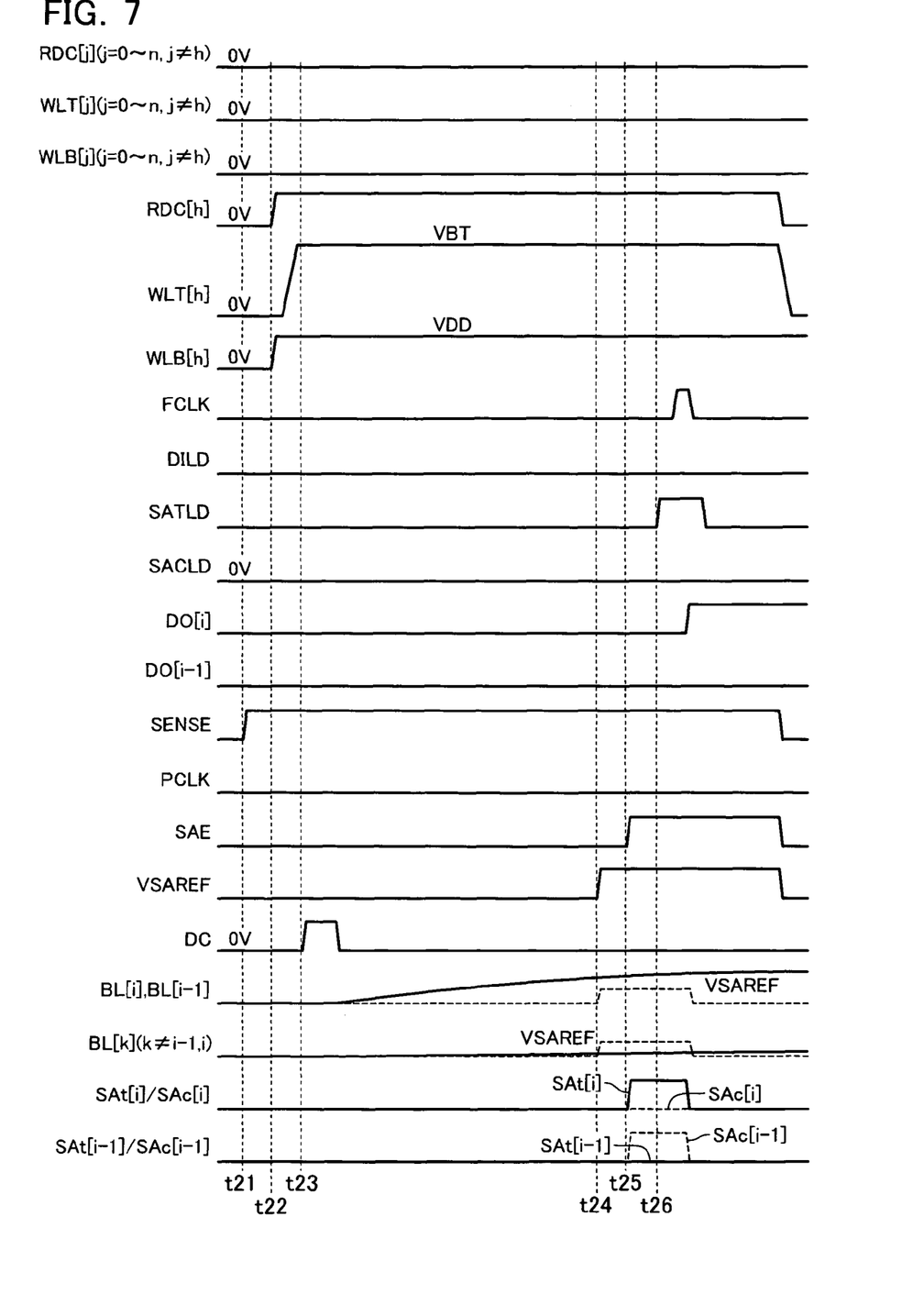
FIG. 7 is a timing diagram of a read operation according to an embodiment.

Referring now to FIG. 7, the read operation of the non-volatile semiconductor memory device according to the embodiment will be described in more detail. FIG. 7 is a timing diagram of the read operation.

First, at time t21, the signal SENSE is set to "H." All transistors 63c to 63e are thus rendered non-conductive, thereby leaving each bit-line BL floating.

Then, at time t22, the signal RDC [h] is set to "H." This activates the word-line driver circuits 40 and 50. The first word-line WLB [h] is thus set to the power supply voltage VDD and the second word-line WLT [h] is set to the on-voltage VBT.

Then, at time t23, the signal DC is set to "H" for a predetermined period. The transistor 61b is thus rendered conductive, thereby discharging the bit-line BL to the ground potential. Then, the signal DC is set again to "L," thus leaving the bit-line BL floating again.

If the first word-line WLB [h] continues to be applied with the voltage VDD and the second word-line WLT [h] continues to be applied with the voltage VBT, the bit-lines BL [i−1] and BL [i] connected to the memory cells MC [h, i−1] and MC [h, i] written with "1" data increases in voltage. The bit-line BL [k] connected to the memory cell MC [h, k] written with the "0" data does not increase in voltage.

Then, at time t24, the signal VSAREF is set to "H." Then, at time t25, the signal SAE is set to "H." These activate the sense amplifier 61. The amplifier 61 thus outputs the signals SAt and SAc depending on the charging state of the bit-line BL.

Then, at time t26, the signal SATLD is set to "H." The signal FCLK then rises. A signal depending on the state of the memory cell MC is thus read as a signal DO [j].

(Advantage of Non-Volatile Semiconductor Memory Device According to an Embodiment)

Description is now given of the advantage of a non-volatile semiconductor memory device according to an embodiment.

In the non-volatile semiconductor memory device according to the embodiment, the control circuit 20 may concurrently program the memory cells MC arranged in the row direction in parallel during a single first write operation. Additionally, the control circuit 20 periodically performs the sense operation after the first write operation. Based on the sensed results, the control circuit 20 performs the second write operation only to the memory cell not written with data during the first write operation. This may cut the cell current through the memory cell MC programmed with "H" data (the written memory cell wMC), thereby controlling the voltage reduction of the first word-line WLB. Controlling the voltage reduction of the first word-line WLB may help avoid the reduction of the applied programming voltage and the resulting increase of the writing time in the nonwritten memory cell MC (non-written memory cell nwMC). Thus, the non-volatile semiconductor memory device according to the embodiment may decrease the programming time.

The non-volatile semiconductor memory device according to the embodiment may read, during the second write (step S12), with the first word-line WLB held at the programming voltage VBP, the state of the memory cell MC (step S105, time t15 to t18 in FIG. 4). Specifically, the device may read the state of the memory cell MC without setting the first word-line WLB to the power supply voltage VDD like in the normal read operation but by keeping the programming voltage used at the time of the program operation (steps S201 to S203). Thus, the non-volatile semiconductor memory device according to the embodiment needs not increase or decrease the voltage of the first word-line WLB during the second write.

The programming voltage VBP is higher than the power supply voltage VDD applied to the first word-line WLB during the normal reading (steps S201 to S203). Thus, the non-volatile semiconductor memory device according to the embodiment may perform the reading in the second write faster than the normal reading.

[Other Embodiments]

Thus, although the invention has been described with respect to particular embodiments of the non-volatile semiconductor memory device, the present invention is not limited to those embodiments. It will be understood that various modifications, additions, substitutions and the like may be made without departing from the spirit of the present invention. For example, the reference voltage VSAREF may be different between the reading (step S105) in the second write (step S12) and the normal reading (steps S201 to S203).

What is claimed is:

1. A non-volatile semiconductor memory device comprising a memory cell array and a control circuit for controlling the memory cell array,
the memory cell array comprising a plurality of word-lines, a plurality of bit-lines, and a plurality of memory cells arranged at the intersections of the word-lines and the bit-lines, each memory cell comprising an electrically programmable antifuse element,
the control circuit being adapted to be able to perform:
as a first step, applying a programming voltage to one of the word-lines while applying a ground voltage to bit-lines each connected to respective selected memory cells to be programmed, thereby concurrently applying the programming voltage to a plurality of the selected memory cells; and
as a second step after the first step, keeping one of the word-lines at the programming voltage while concurrently reading the electrical states of a plurality of the selected memory cells, and according to the electrical states of a plurality of the memory cells, applying the ground voltage again to a bit-line connected to an unprogrammed selected memory cell after the first step, and applying a voltage higher than the ground voltage to a bit-line connected to a programmed selected memory cell after the first step.

2. The non-volatile semiconductor memory device according to claim 1, wherein
in the second step, the control circuit leaves each selected bit-line floating and senses the resulting voltage of the selected bit-line to determine whether the selected memory cell is written in the first step.

3. The non-volatile semiconductor memory device according to claim 1, wherein
the second step is repeated at a predetermined cycle.

4. The non-volatile semiconductor memory device according to claim 1, wherein
each memory cell comprises a first transistor including a source, a drain, and a control gate,
the source and drain are connected to the bit-line and one end of the antifuse element, respectively, and
the control gate is applied with a predetermined voltage to render the first transistor conductive for writing or reading of the memory cell.

5. The non-volatile semiconductor memory device according to claim 1, wherein
the antifuse element comprises a gate-insulating film of an MOS transistor.

6. The non-volatile semiconductor memory device according to claim 1, wherein
the control circuit comprises:
a first control portion configured to determine the electrical state of the memory cell;
a second control portion configured to store the electrical state of the memory cell according to determination of the first control portion; and
a third control portion configured to control a potential of the bit-line according to an output from the second control portion, and wherein
the first control portion comprises:
a sense amplifier comprising a first input terminal connected to the bit-line and a second input terminal to be applied with a reference voltage; and
a second transistor comprising a first end connected to the bit-line and a grounded second end.

7. The non-volatile semiconductor memory device according to claim 6, wherein
the second control portion comprises:
a selector circuit configured to selectively output, as an output signal, a first signal input from the sense amplifier, a second signal that is inversion signal of the first signal, and a third signal input from external; and
a flip-frop circuit configured to store the output signal from the selector circuit.

8. The non-volatile semiconductor memory device according to claim 1, wherein
in the first step, the control circuit raises the bit-lines to a predetermined voltage and applying a ground voltage to the bit-lines connected to the selected memory cells.

9. The non-volatile semiconductor memory device according to claim 1, wherein
the control circuit concurrently reads data from the selected memory cells to be read by applying a read voltage to one of the word-lines and by applying a ground voltage to a plurality of the bit-lines and then leaving a plurality of the bit-lines floating.

10. The non-volatile semiconductor memory device according to claim 9, wherein
in the second step, the control circuit compares the bit-line voltage with a first reference voltage,
in reading data, the control circuit compares the bit-line voltage with a second reference voltage, the first reference voltage being different from the second reference voltage.

11. The non-volatile semiconductor memory device according to claim 4, wherein
the control circuit comprises;
a row decoder configured to output an address signal;
a first driver circuit configured to selectively output a control signal to the gate of the first transistor according to the address signal to render the first transistor conductive; and
a second driver circuit configured to selectively apply the programming voltage to the word-line according to the control signal.

12. A non-volatile semiconductor memory device comprising a memory cell array and a control circuit for controlling the memory cell array,
the memory cell array comprising a plurality of word-lines, a plurality of bit-lines, and a plurality of memory cells arranged at the intersections of the word-lines and the bit-lines, each memory cell comprising an electrically programmable antifuse element,
the control circuit being adapted to be able to perform:
as a first step, applying a programming voltage to one of the word-lines while applying a ground voltage to bit-lines each connected to respective selected memory cells to be programmed, thereby concurrently applying the programming voltage to a plurality of the selected memory cells; and,
as a second step after the first step, keeping one of the one word-lines at the programming voltage, and leaving each selected bit-line floating and sensing the resulting voltage of each selected bit-line to determine which of the selected memory cells is unprogrammed after the first step.

13. The non-volatile semiconductor memory device according to claim 12 wherein,
the second step is repeated at a predetermined cycle.

14. The non-volatile semiconductor memory device according to claim 12, wherein
each memory cell comprises a first transistor including a source, a drain, and a control gate,
the source and drain are connected to the bit-line and one end of the antifuse element, respectively, and
the control gate is applied with a predetermined voltage to render the first transistor conductive for writing or reading of the memory cell.

15. The non-volatile semiconductor memory device according to claim 12, wherein
the antifuse element comprises a gate-insulating film of an MOS transistor.

16. The non-volatile semiconductor memory device according to claim 12, wherein
the control circuit comprises:
a first control portion configured to determine the electrical state of the memory cell;
a second control portion configured to store the electrical state of the memory cell according to determination of the first control portion; and
a third control portion configured to control a potential of the bit-line according to an output from the second control portion, and wherein
the first control portion comprises:
a sense amplifier comprising a first input terminal connected to the bit-line and a second input terminal to be applied with a reference voltage; and
a second transistor comprising a first end connected to the bit-line and a grounded second end.

17. The non-volatile semiconductor memory device according to claim 16, wherein
the second control portion comprises:
a selector circuit configured to selectively output, as an output signal, a first signal input from the sense amplifier, a second signal that is inversion signal of the first signal, and a third signal input from external; and
a flip-frop circuit configured to store the output signal from the selector circuit.

18. The non-volatile semiconductor memory device according to claim 12, wherein
in the first step, the control circuit raises the bit-lines to a predetermined voltage and applying a ground voltage to the bit-lines connected to the selected memory cells.

19. The non-volatile semiconductor memory device according to claim 12, wherein
the control circuit concurrently reads data from the selected memory cells to be read by applying a read voltage to one of the word-lines and by applying a ground voltage to a plurality of the bit-lines and then leaving a plurality of the bit-lines floating.

20. A method of writing data in a non-volatile semiconductor memory device comprising a memory cell array, the memory cell array comprising a plurality of word-lines, a plurality of bit-lines, and a plurality of memory cells arranged at the intersections of the word-lines and the bit-lines, each memory cell comprising an electrically programmable antifuse element,
the method comprising:
as a first step, applying a programming voltage to one of the word-lines while applying a ground voltage to bit-lines each connected to respective selected memory cells to be programmed, thereby concurrently applying the programming voltage to a plurality of the selected memory cells; and
as a second step after the first step, keeping one of the word-lines at the programming voltage while concurrently reading the electrical states of a plurality of the selected memory cells, and according to the electrical states of a plurality of the memory cells, applying the ground voltage again to a bit-line connected to an unprogrammed selected memory cell after the first step, and applying a voltage higher than the ground voltage to a bit-line connected to a programmed selected memory cell after the first step.

* * * * *